(12) United States Patent
Tierling

(10) Patent No.: US 8,102,364 B2
(45) Date of Patent: *Jan. 24, 2012

(54) ENVELOPE MODULATOR FOR HAPTIC FEEDBACK DEVICES

(75) Inventor: Kollin M. Tierling, Milpitas, CA (US)

(73) Assignee: Immersion Corporation, San Jose, CA (US)

( * ) Notice: Subject to any disclaimer, the term of this patent is extended or adjusted under 35 U.S.C. 154(b) by 730 days.

This patent is subject to a terminal disclaimer.

(21) Appl. No.: 11/598,949

(22) Filed: Nov. 13, 2006

(65) Prior Publication Data

US 2007/0057916 A1    Mar. 15, 2007

Related U.S. Application Data

(63) Continuation of application No. 10/208,575, filed on Jul. 29, 2002, now Pat. No. 7,154,470.

(60) Provisional application No. 60/309,913, filed on Aug. 2, 2001.

(51) Int. Cl.
*G09G 5/00* (2006.01)
*H04R 25/00* (2006.01)
*G06G 7/48* (2006.01)

(52) U.S. Cl. .............................. 345/156; 381/151; 703/3

(58) Field of Classification Search ........... 345/156–163
See application file for complete search history.

(56) References Cited

U.S. PATENT DOCUMENTS

| | | | |
|---|---|---|---|
| 3,623,046 A | 11/1971 | Scourtes | |
| 4,262,240 A | 4/1981 | Arai | |
| 4,382,217 A | 5/1983 | Horner et al. | |
| 4,731,603 A | 3/1988 | MacRae et al. | |
| 5,022,384 A | 6/1991 | Freels et al. | |
| 5,184,310 A | 2/1993 | Takenouchi | |
| 5,194,786 A | 3/1993 | Smith et al. | |
| 5,388,992 A | 2/1995 | Franklin et al. | |
| 5,435,729 A | 7/1995 | Hildreth et al. | |
| 5,649,020 A * | 7/1997 | McClurg et al. | 381/151 |
| 5,684,722 A * | 11/1997 | Thorner et al. | 703/3 |
| 5,805,601 A | 9/1998 | Takeda et al. | |
| 5,952,806 A | 9/1999 | Muramatsu | |
| 6,020,876 A | 2/2000 | Rosenberg et al. | |
| 6,216,059 B1 | 4/2001 | Ierymenko | |
| 6,333,753 B1 * | 12/2001 | Hinckley | 715/768 |
| 6,414,607 B1 | 7/2002 | Gonring et al. | |

(Continued)

OTHER PUBLICATIONS

Ouh-young, Ming, Ph.D; Force display in molecular docking; 1990; The Universilty of North Carolina at Chapel Hill; pp. 81, 111-112.*
Ouh-Young, Ming, et al., "Using A Manipulator For Force Display In Molecular Docking," In: Proceedings of 1988 IEEE Robotics and Automation Conference, vol. 3, Philadelphia, PA, 1988, pp. 1824-1829.

(Continued)

*Primary Examiner* — Alexander S Beck
*Assistant Examiner* — Charles V Hicks
(74) *Attorney, Agent, or Firm* — Squire, Sanders & Dempsey (US) LLP

(57) ABSTRACT

An amplitude modulator circuit includes a reference oscillator and an envelope modulator coupled to the reference oscillator for receiving a reference signal. A microcontroller is coupled to the envelope modulator for providing an envelope signal to the envelope modulator and a low pass filter is coupled to the envelope modulator for receiving a modulated command from the envelope modulator. An inverter is coupled to the low pass filter for receiving a low passed envelope modulated signal from the low pass filter and a transducer or amplifier is coupled to the inverter and the low pass filter for receiving an inverted low passed signal and the low passed envelope modulated signal.

21 Claims, 2 Drawing Sheets

U.S. PATENT DOCUMENTS

| | | | | |
|---|---|---|---|---|
| 6,531,998 | B1 * | 3/2003 | Gordon | 345/156 |
| 6,693,622 | B1 * | 2/2004 | Shahoian et al. | 345/156 |
| 7,154,470 | B2 | 12/2006 | Tierling | |
| 7,218,310 | B2 | 5/2007 | Tierling et al. | |

OTHER PUBLICATIONS

Jones, L. A. et al., "A Perceptual Analysis of Stiffness," 79 Experimental Brain Research No. 1, 1990, pp. 150-156.

* cited by examiner

US 8,102,364 B2

ENVELOPE MODULATOR FOR HAPTIC FEEDBACK DEVICES

CROSS-REFERENCES TO RELATED APPLICATIONS

This application is a continuation of Ser. No. 10/208,575 filed Jul. 29, 2002, which claims priority to U.S. Provisional Application No. 60/309,913 filed Aug. 2, 2001, which is herein incorporated by reference for all purposes. It also claims priority to application Ser. No. 09/908,184 filed Jul. 17, 2001.

BACKGROUND OF THE INVENTION

The present invention relates generally to the control of haptic feedback interface devices that interface a user with a computer device.

Humans interface with electronic and mechanical devices in a variety of applications, and the need for a more natural, easy-to-use, and informative interface is a constant concern. In the context of the present invention, humans interface with computer devices for a variety of applications. One such application is interacting with computer-generated environments such as games, simulations, and application programs. Computer input devices such as mice and trackballs are often used to control a cursor within a graphical environment and provide input in these applications. In portable computer or electronic devices, such as laptop computers or personal digital assistants (PDAs), mice typically have too large a workspace to be practical. A popular device for portable computers are "touchpads," or touchscreens, which are small rectangular, planar pads that sense the location of a pointing object by any of a variety of sensing technologies.

In some interface devices, haptic feedback is also provided to the user. These types of interface devices can provide physical sensations which are felt by the user manipulating the user object of the interface device. One or more motors or other type of actuators are coupled to the device housing or manipulandum and are connected to the controlling computer system. The computer system controls forces output by the actuators in conjunction and coordination with displayed events. The computer system can thus convey physical force sensations to the user in conjunction with other supplied feedback as the user is grasping or contacting the interface device or manipulatable object.

In many haptic feedback devices, the haptic feedback takes the form of vibrations, jolts, or pulses output on the housing or manipulandum and are thus experienced by the user, referred to as "tactile" sensations herein. For example, many gamepad devices include a spinning eccentric mass that creates inertial vibrations on the housing or object. Other devices, such as the I-Feel Mouse from Logitech Corp., provide inertial vibrations using a linearly-moving mass. Still other devices may vibrate a housing or object by impacting or directly moving the housing or object with the actuator.

One problem with current haptic feedback devices is that tactile sensations output to the user tend to be more effective in particular frequency ranges and are less effective in other frequency ranges, thus causing haptic sensations to feel uneven and inconsistent to the user over broad frequency ranges.

SUMMARY OF THE INVENTION

In accordance with one aspect of the present invention, an amplitude modulator circuit comprises a reference oscillator and an envelope modulator coupled to the reference oscillator for receiving a reference signal. A microcontroller is coupled to the envelope modulator for providing an envelope signal to the envelope modulator and a low pass filter is coupled to the envelope modulator for receiving a modulated command from the envelope modulator. An inverter is coupled to the low pass filter for receiving a low passed envelope modulated signal from the low pass filter and a transducer or amplifier is coupled to the inverter and the low pass filter for receiving an inverted low passed signal and the low passed envelope modulated signal.

In accordance with another aspect of the present invention, the reference oscillator comprises a sine wave generator.

In accordance with a further aspect of the present invention, the envelope modulator comprises a ramp generator circuit.

In accordance with yet another aspect of the present invention, the low pass filter is a second order low pass filter.

In accordance with a further aspect of the present invention, a method of amplitude modulation of a resonant frequency sinusoid by a pulse width modulated envelope function comprises providing an envelope wave shape to an envelope modulator, providing a sinusoidal reference signal to the envelope modulator, providing a modulated command from the envelope modulator to a low pass filter, providing a low passed modulated command signal from the low pass filter to an inverter and a transducer or amplified, and providing an inverted low passed modulated command signal from the inverter to the transducer or amplifier passed modulated command signal.

Other features and advantages of the present invention will be understood upon reading and understanding the description of the preferred exemplary embodiments, found hereinbelow, in conjunction with reference to the drawings, in which like numerals represent like elements.

DESCRIPTION OF SPECIFIC PREFERRED EXEMPLARY EMBODIMENTS

The present invention is an alternative embodiment of an envelope modulation approach referred to in patent application Ser. No. 09/908,184, filed Jul. 17, 2001, which is incorporated herein by reference in its entirety for all purposes. That invention as well as the one described herein, provides methods used to modulate a high frequency signal, suitable for driving a vibrotactile transducer, with a lower frequency signal that contains tactile information. The composite or modulated signal is used to drive an actuator that conveys the lower frequency tactile information to the human user via electrical amplification that drives a transducer, thereby mechanically conveying the tactile information to the user. The high frequency signal oscillates at a frequency that is close to the resonant frequency of the mechanical actuator driven by the transducer, and hence the haptic sensations benefit from mechanical amplification caused by the resonant signal. In patent application Ser. No. 09/908,184, one methodology described is to multiply a resonant frequency sinusoid by the modulating envelope. The amplitude modulated sinusoid then commands an amplifier as a pulse width modulated signal.

A conventional approach requires that the pulse width modulated (PWM) frequency be updated at a high rate in order to accurately conform to a sinusoidal resonant frequency waveform. Deviations front a pure sinusoid generate audible noise in the actuator that detracts from the actuator as a tactile device. A high PWM update rate would be necessary to accurately command a sinusoid that may be in the 100 to 200 Hz range. Such a high update rate would consume significant processor duty cycle and potentially require a more costly processor than with the invention described herein.

The present invention describes amplitude modulation of a resonant frequency sinusoid by a pulse width modulated envelope function to provide strong haptic sensations over a broad frequency range.

A preferred embodiment of the present inventive approach is to use an electronic circuit to perform the envelope modulation function so that the processor only needs to command the envelope wave shape, which is a much lower frequency signal that requires a lower processor update rate. Use of a single electronic circuit reduces costs of the device, since separate components such as op amps or other amplifiers are not required.

Figure 1:
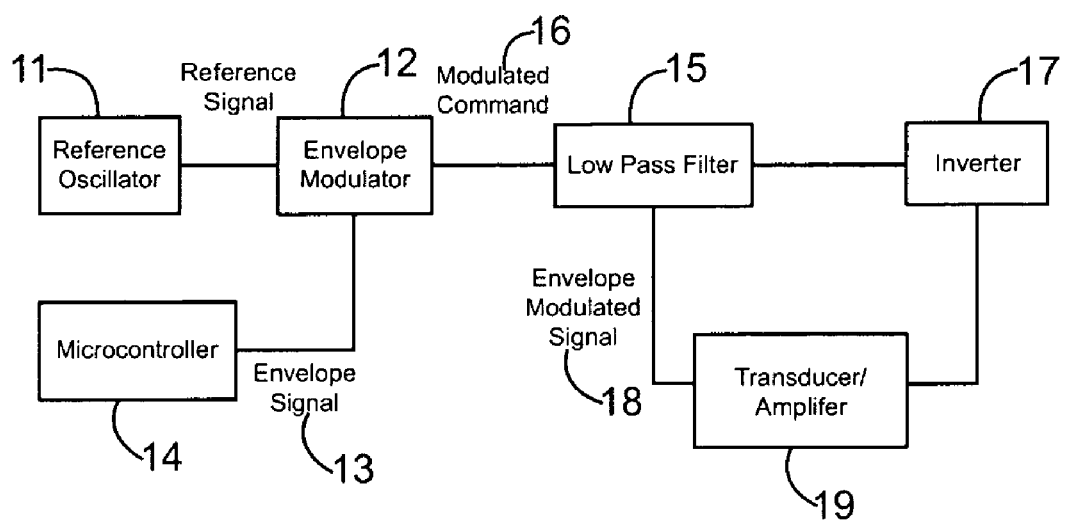
FIG. 1 is a schematic view illustrating a design topology of an embodiment of a circuit in accordance with the present invention.

FIG. 1 illustrates a design topology of one embodiment of the present invention. The inventive circuit topology 10 includes a signal generator ("reference oscillator") 11 that produces a sinusoidal reference signal with a frequency that is the same as (or close to) the mechanical resonant frequency of the tactile actuator. If the mechanical system has more than one resonant frequency, one of the resonant frequencies is chosen at which the oscillator will provide the signal. An actuator, such as a piezoelectric actuator or other actuator driving an oscillating mass or manipulandum, typically has a resonant frequency at which output forces (vibrations) are strongest due to the mechanical properties of the system. It is this resonant frequency at which the actuator is preferably driven.

The circuit topology of FIG. 1 also includes an envelope modulator 12 that amplitude modulates the reference signal output by the reference oscillator with an envelope signal 13 from a microcontroller (processor) 14, such as a microprocessor, state machines, etc. The envelope signal can include haptic effects or features that are desired to be output to the user, such as a jolt, a vibration of a desired frequency, etc. A low pass filter 15 receives modulated command 16 output by the envelope modulator. The low pass filter removes the high frequency content of the command envelope signal from the processor. An inverter 17 receives the low passed signal from the filter to provide a differential output signal. The low passed envelope modulated signal 18 from the low pass filter is also sent to a transducer or amplifier 19, such as a piezo transducer or motor amplifier. The inverted low passed signal from the inverter is also sent to the transducer or amplifier so that a differential drive signal is provided to the transducer or amplifier. Other embodiments can produce a single ended signal that either drives the transducer directly or indirectly through an amplifier.

Figure 2:
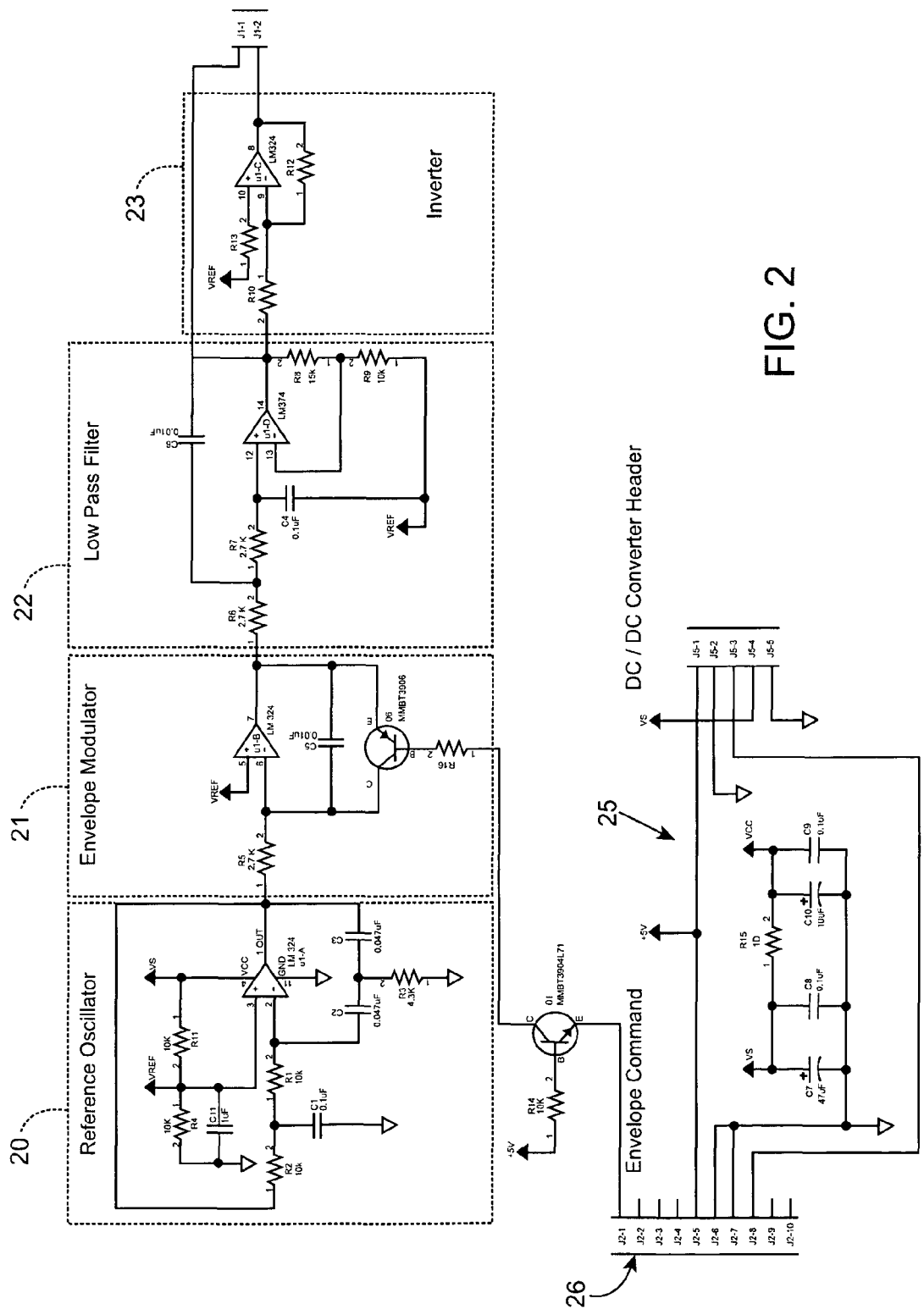
FIG. 2 is a schematic of an example of a circuit in accordance with the present invention.

FIG. 2 illustrates an example of a more detailed embodiment of the present invention. This embodiment consists of four circuits. The first circuit is a sine wave generator (reference oscillator) 20. The sine wave generator produces a reference sinusoidal function with a frequency that is the same as (or close to) a mechanical resonant frequency of the actuator. This reference signal is one of the two signals used by the second circuit. The signal generator is preferably a free-running oscillator that is formed by a double integrating feedback loop.

The second circuit is an envelope modulator 21 that generates a series of pulses at the processor's PWM frequency (for example, nominally 24 kHz) with an amplitude that is proportional to the instantaneous voltage of the reference sinusoid. This circuit is preferably a ramp generator that is reset when the PWM signal is low. When the PWM signal is high, the ramp generator produces a sawtooth output signal with an output voltage that increases linearly in time at a rate that is proportional to the instantaneous voltage of the reference sinusoid. In this way, the circuit produces a series of sawtooth pulses with a width proportional to the PWM duty cycle and height proportional to the instantaneous voltage of the reference sinusoid. The average voltage of the sawtooth signal is therefore the same as a signal that would be produced by directly multiplying the reference sinusoid by the PWM command signal. The sawtooth signal output waveform from this circuit then feeds into the third circuit. An envelope command indicating envelope wave shape is provided by microprocessor 25 at output 26.

The third circuit is a second order low pass filter 22 with a corner frequency that lies between the resonant frequency of the actuator (or mechanical system) and the pulse width modulation frequency of the command signal. The fourth circuit is an inverter 23 that inverts the output of the third circuit. The signals output from the third and fourth circuits constitute a differential drive signal that is modulated at the reference sinusoid frequency and has an amplitude that is proportional to the duty cycle of the commanded PWM signal. This differential drive signal can then drive a piezo transducer directly or be amplified to drive an electric motor (such as a DC motor) or other actuator.

The invention frees the processor from the task of performing the envelope modulation function at a sufficiently high update rate to produce a clean modulated sinusoidal output.

A prototype circuit demonstrated that the circuit was able to drive either one or two piezo transducers, and that a constant frequency sinusoidal waveform was being modulated by the PWM envelope command from a TouchSense processor. The prototype circuit further demonstrated that the generated waveform was exciting an inertially grounded mass/transducer/spring system at its mechanical resonant frequency. The frequency of the sinusoidal driving function was tuned to the resonant frequency of the mechanical system. The tactile sensation felt when touching the mass in the mechanical system conveyed the impression that it was excited at the much lower envelope function frequency rather than the mechanical system's resonant frequency.

The present invention is suitable to drive actuators to provide haptic sensations in a variety of haptic feedback computer interface devices, including mice, joysticks, trackballs, gamepads, remote controls, PDA's, touchpads for laptop computers, touchscreens for a variety of devices, gloves, steering wheels, etc. Some examples of suitable devices and haptic sensations are described in copending application Ser. No. 09/917,263, filed Jul. 26, 2001, entitled, "Haptic Interface for Laptop Computers and Other Portable Devices," including piezoelectric transducer embodiments, and which is incorporated herein by reference in its entirety for all purposes. Other tactile devices and sensations used for inertial tactile feedback, and suitable for use with the present invention, are described in U.S. Pat. Nos. 6,211,861 and 6,088,019 and application Ser. Nos. 09/585,741, and 09/487,737, all incorporated herein by reference in their entirety for all purposes. Other interface device embodiments suitable for use with the present invention are described in Ser. Nos. 09/759,780, 60/236,417, and 60/236,558, incorporated by reference herein in their entirety for all purposes.

While this invention has been described in terms of preferred exemplary embodiments, there are alterations, modifications, and permutations thereof which fall within the scope of this invention. It should also be noted that the embodiments described above can be combined in various ways in a particular implementation. Furthermore, certain terminology has been used for the purposes of descriptive clarity, and not to limit the present invention.

What is claimed is:

1. A circuit adapted to be coupled to an actuator having a resonant frequency, the circuit comprising:
   a reference signal generator that generates a reference signal having a frequency substantially the same as the resonant frequency;
   a processor that generates an envelope signal that includes haptic effects information;
   a modulator coupled to the reference signal generator and the processor, wherein the modulator amplitude modulates the reference signal with the envelope signal to generate a modulated signal; and
   a filter coupled to the modulator that removes high frequency content from the modulated signal to generate an output signal;
   wherein the output signal, when applied as a drive signal to the actuator, causes the actuator to generate haptic effects based on the haptic effects information.

2. The circuit of claim 1, wherein the envelope signal is a pulse width modulated signal.

3. The circuit of claim 1, wherein the reference signal generator comprises an oscillator.

4. The circuit of claim 1, wherein the processor has a pulse width modulated frequency and the reference signal is a reference sinusoid with an instantaneous voltage;
   wherein the modulated signal comprises a series of pulses at the pulse width modulated frequency with an amplitude that is proportional to the instantaneous voltage.

5. The circuit of claim 4, wherein the modulator is a ramp generator.

6. The circuit of claim 2, wherein the filter has a corner frequency between the resonant frequency and a pulse width modulation frequency of the envelope signal.

7. The circuit of claim 1, wherein the output signal is a differential drive signal.

8. The circuit of claim 1, further comprising an inverter coupled to the filter.

9. The circuit of claim 1, further comprising an amplifying driver coupled to the filter.

10. A method of generating a haptic effect, the method comprising:
    generating a reference signal having a frequency substantially the same as a resonant frequency of an actuator;
    generating an envelope signal that includes haptic effects information;
    modulating the reference signal with the envelope signal to generate a modulated signal;
    removing high frequency content from the modulated signal to generate an output signal;
    applying the output signal as a drive signal to the actuator, causing the actuator to generate the haptic effects based on the haptic effects information.

11. The method of claim 10, wherein the envelope signal is a pulse width modulated signal.

12. The method of claim 10, wherein the reference signal generator is generated by an oscillator.

13. The method of claim 10, wherein the envelope signal is generated by a processor that has a pulse width modulated frequency and the reference signal is a reference sinusoid with an instantaneous voltage;
    wherein the modulated signal comprises a series of pulses at the pulse width modulated frequency with an amplitude that is proportional to the instantaneous voltage.

14. The method of claim 10, wherein the output signal is a differential drive signal.

15. The method of claim 10, further comprising amplifying the output signal.

16. A modulator for a haptic feedback device that generates haptic effects with an actuator having a resonant frequency, the modulator comprising:
    a first input for receiving from a reference signal generator a reference signal having a frequency substantially the same as the resonant frequency;
    a second input for receiving from a processor an envelope signal that includes haptic effects information;
    circuitry coupled to the first and second input for modulating the reference signal with the envelope signal to generate a modulated signal; and
    an output coupled to a filter that removes high frequency content from the modulated signal to generate an output signal;
    wherein the output signal, when applied as a drive signal to the actuator, causes the actuator to generate the haptic effects based on the haptic effects information.

17. The modulator of claim 16, wherein the envelope signal is a pulse width modulated signal.

18. The modulator of claim 16, wherein the reference signal generator comprises an oscillator.

19. The modulator of claim 16, wherein the processor has a pulse width modulated frequency and the reference signal is a reference sinusoid with an instantaneous voltage;
    wherein the modulated signal comprises a series of pulses at the pulse width modulated frequency with an amplitude that is proportional to the instantaneous voltage.

20. The modulator of claim 16, wherein the modulator is a ramp generator.

21. The modulator of claim 16, wherein the output signal is a differential drive signal.

* * * * *